US 6,529,023 B2

(12) United States Patent
Becker et al.

(10) Patent No.: US 6,529,023 B2
(45) Date of Patent: Mar. 4, 2003

(54) APPLICATION AND TEST METHODOLOGY FOR USE WITH COMPRESSION LAND GRID ARRAY CONNECTORS

(75) Inventors: Wiren D. Becker, Hyde Park, NY (US); Michael F. McAllister, Clintondale, NY (US); Gerhard Ruehle, Sindelfingen (DE)

(73) Assignee: International Business Machines Corporation

( * ) Notice: Subject to any disclaimer, the term of this patent is extended or adjusted under 35 U.S.C. 154(b) by 0 days.

(21) Appl. No.: 09/860,189

(22) Filed: May 17, 2001

(65) Prior Publication Data

US 2002/0171442 A1 Nov. 21, 2002

(51) Int. Cl.[7] ............................................... G01R 31/28
(52) U.S. Cl. ..................... 324/754; 324/158.1
(58) Field of Search ............................. 324/158.1, 754, 324/72.5, 761, 762, 765, 73.1; 439/66, 264, 526, 67, 482, 824, 35, 78; 361/807

(56) References Cited

U.S. PATENT DOCUMENTS

| 5,123,850 | A | * | 6/1992 | Elder et al. ................ 439/67 |
|---|---|---|---|---|
| 5,127,837 | A | * | 7/1992 | Shah et al. .................. 439/71 |
| 5,384,692 | A | * | 1/1995 | Jaff ............................ 361/807 |
| 5,397,245 | A | * | 3/1995 | Roebuck et al. ............ 439/264 |
| 5,468,157 | A | * | 11/1995 | Roebuck et al. ............ 439/264 |
| 5,468,158 | A | * | 11/1995 | Roebuck et al. ............ 439/264 |
| 5,571,027 | A | * | 11/1996 | Roebuck et al. ............ 439/264 |
| 5,660,562 | A | * | 8/1997 | Lin ............................ 439/487 |
| 5,883,788 | A | | 3/1999 | Ondricek et al. ........... 361/768 |
| 5,940,278 | A | | 8/1999 | Schumacher ................ 361/769 |
| 6,114,757 | A | | 9/2000 | DelPrete ..................... 257/678 |
| 6,252,391 | B1 | * | 6/2001 | McAllister et al. ......... 324/149 |
| 6,219,241 | B1 | * | 4/2002 | Jones .......................... 361/704 |

\* cited by examiner

*Primary Examiner*—Michael Sherry
*Assistant Examiner*—Jimmy Nguyen
(74) *Attorney, Agent, or Firm*—Lynn L. Augspurger; Harness, Dickey & Pierce

(57) ABSTRACT

A counterbalancing arrangement for use with a compressive land grid array connector system provides a counterbalancing load element at a side of a system circuit board opposite a back side holding an integrated circuit chip substrate via the connector system. In a first aspect, the counterbalancing load element is a probe template and spacer element providing measurement across to the integrated circuiting. In another aspect, the counterbalancing load element is a mirror image integrated circuit land grid array connector system.

8 Claims, 8 Drawing Sheets

APPLICATION AND TEST METHODOLOGY FOR USE WITH COMPRESSION LAND GRID ARRAY CONNECTORS

FIELD OF THE INVENTION

The invention relates to a test methodology and application for measurements and enhancements to multi-chip and single chip modules that are attached to interface wiring boards by a compression scheme that blocks direct access to input/output (I/O) locations.

BACKGROUND OF THE INVENTION

As higher density connectors are implemented on systems, there is a growing demand for connector schemes that permit significant I/O densities while at the same time provide for excellent signal integrity interconnection to the next level of packaging. With the advent of Land Grid Array (LGA) compression connectors as defined by Thomas and Batts, the density and signal integrity problems are addressed. A new problem for suitable test interface to the I/O connections of a chip carrier now becomes apparent. The LGA connector requires an electrically insulated backing structure to counter balance the forces used to compress the chip carrier to the system board. In the common application of this arrangement, an insulator sheet of FR4 and metal plate are used, which by nature of their design, covers entirely the access to the connector area on the board and hence the inputs and outputs of the chip carrier. In most applications this is permissible, but when access is needed, as in system bring-up, device monitoring, or circuit measurements, it is necessary to provide access to those pin locations while maintaining excellent electrical measurement characteristics.

SUMMARY OF THE INVENTION

This invention addresses the access of measurement locations of system boards interfaces with the use of Land Grid Array compression connection schemes, while at the same time maintaining excellent high frequency electrical characteristic capabilities. It is also possible to carry the counter balance technique further and permit the attachment of two MCMs back to back with different or similar functions to co-exist in the same location on a system board.

BRIEF DESCRIPTION OF THE DRAWINGS

The objects and features of the invention will be understood from a reading of the Detailed Description, taken in conjunction with the drawings, in which.

DETAILED DESCRIPTION OF THE PREFERRED EMBODIMENTS

As the input/output (I/O) density per given area of chip carriers increases, the ability for electrical and performance measurements is restricted and in some applications, is precluded due to the inability to access the carrier's I/O locations. Standard test probes and methods cannot be used with chip carriers mounted on system boards with I/Os on 1 mm pitch and smaller without destructive damage and/or special net routings which could impact system performance. The LGA connector system as defined by Thomas and Batts in U.S. Pat. No. 6,114,757 permits I/Os to be on these very tight grids, but require a counter balance of compression force to the chip carrier across the connector area, making access to the I/Os impossible. A solution to this problem is to provide for a probeable interface that works in conjunction with the compression hardware, such that a nondestructive measurable interface is formed.

Figure 1:
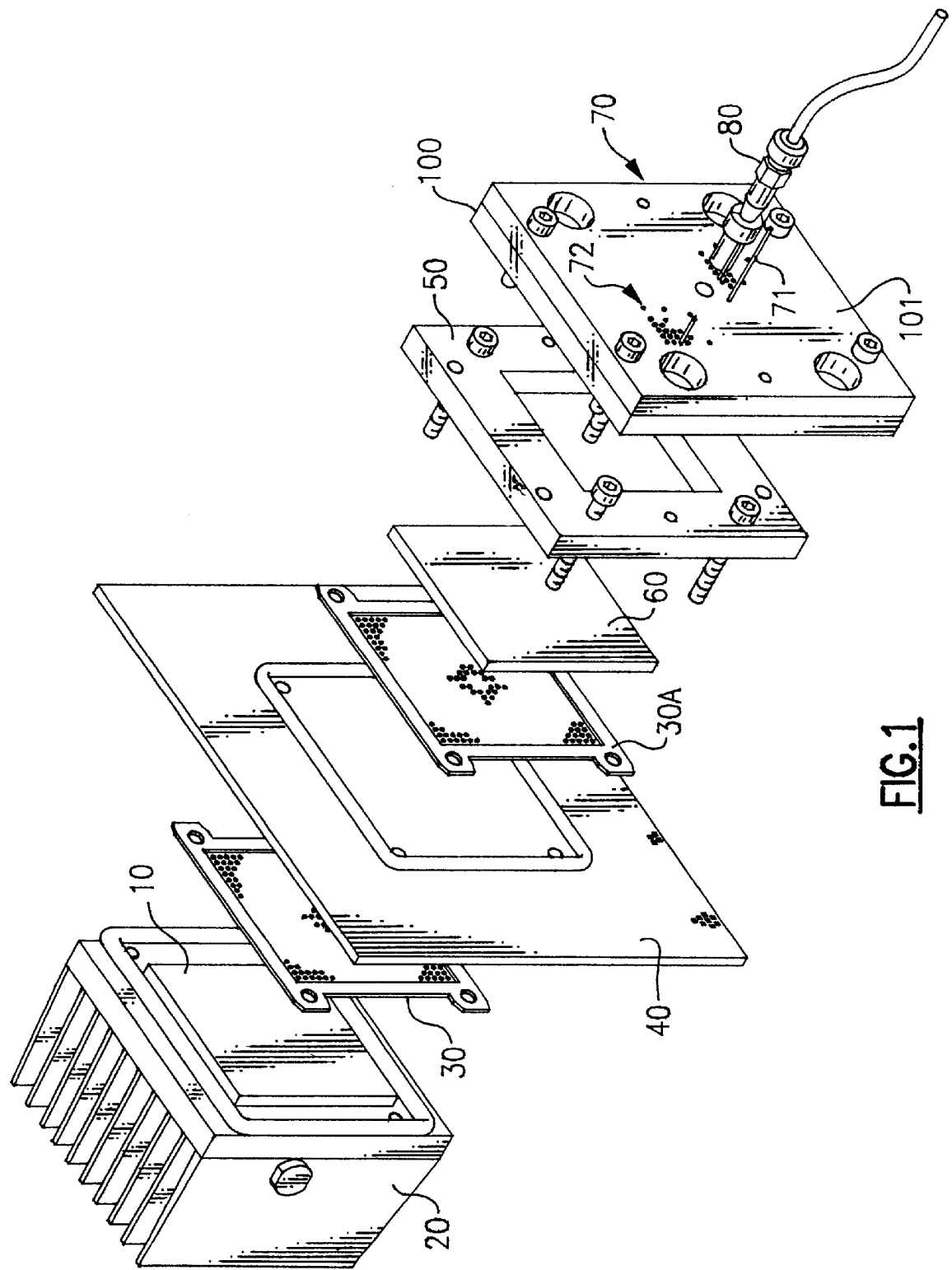
FIG. 1 illustrates an isometric exploded view of an unbalanced grid scheme arranged in accordance with the principles of the present invention.
Figure 1A:
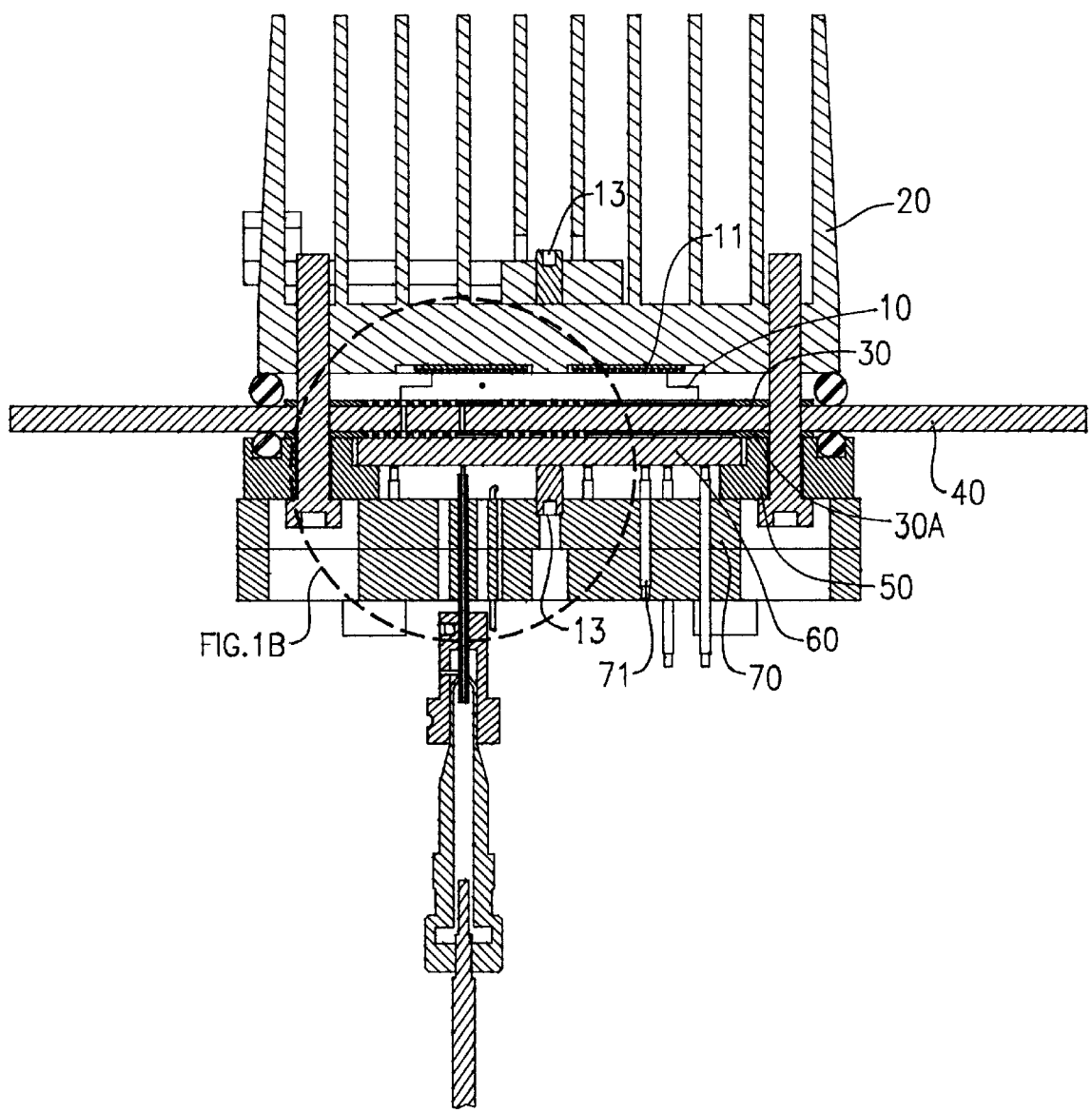
FIG. 1A illustrates a cross-section of the unbalanced grid scheme of FIG. 1.
Figure 1B:
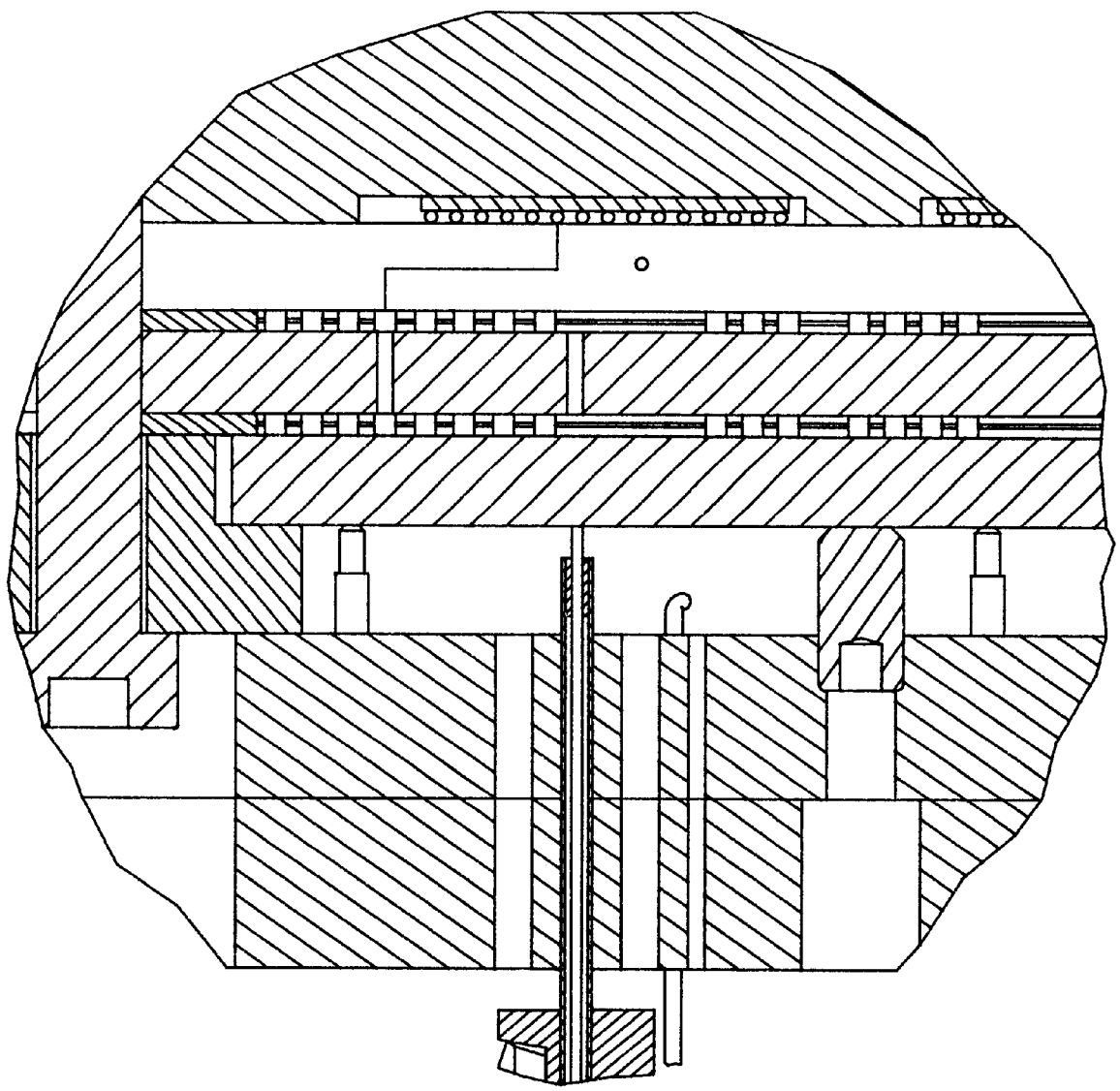
FIG. 1B sets forth more detail of area 1B of FIG. 1A.

As can be seen in FIG. 1, an exploded view is given of a Multi-Chip Module (MCM) 10 attached to a system board 40 using the Thomas and Batts (T&B) compression connector 30 to connect the MCM 10 to the system board 40. MCM 10 is encapsulated with a cooling cap 20, and the resulting fixture is fitted with the T&B LGA connector film 30. The cooling cap 20, in conjunction with the compression retainer, is designed to distribute an even pressure to the ceramic substrate of MCM 10. This can be accomplished by a structural design that provides support to each side of the substrate with an additional centrally located distribution point 13 (FIG. 1A). This central support structure 13 may reduce the impact of the cooling structure 20 on the thermo paste interface 11 (FIG. 1A) that would inadvertently affect the proper cooling of the chips. The completed structure is then mounted to a system board 40 by a retaining fixture 50.

When the I/O density of the MCM 10 is such that present day probing techniques cannot be applied, a transformation substrate 60 is designed to relocate the I/Os of one grid spacing to another grid spacing. This space transformer 60 will provide the required backing structure as well as a method to bring selected I/Os out to testable locations. To insure mechanical stability, the ceramic space transformer backing structure 60 should be the same thickness as that of the MCM structure 10.

The space transformer 60 is connected to the system board 40 by an identical T&B connector film 30A as previously used with the MCM carrier. A probe template assembly 70, as described in U.S. patent application Ser. No. filed as Docket No. P0998071, in conjunction with a probe structure 80 as described in U.S. patent application Ser. No. filed as Docket No. P0998072, will permit the high frequency testing of system parameters with minimal impact on signal integrity. The mechanical structure used to compress the MCM 10 to the system board 40 could be designed in a manner that would permit a test space transformer or an insulated pressure plate to be interchangeable.

In situations where the Device Under Test (DUT) I/O grid permits a more conventional grid spacing, the space transformer 60 may not be required, and the probe template 70 can be used for both the backing structure as well as the probing fixture.

The counter force needed to balance the load applied from the DUT is provided by two methods. The first counter pressure area is a FR4 insulation structure 50 placed between the metal probe template body 100 and the board 40 and is used as the primary support structure. Secondary countering force is supplied by ground pins 71, that are equally spaced across the I/O pad grid.

The probe template assembly, in addition to metal plate 100, includes an insulative cover plate 101 which may carry a hole template 72 which need not match the hole template in plate 100. Cover plate 101 additionally may carry appropriate labels for the probe access holes of the template pattern.

Figure 2:
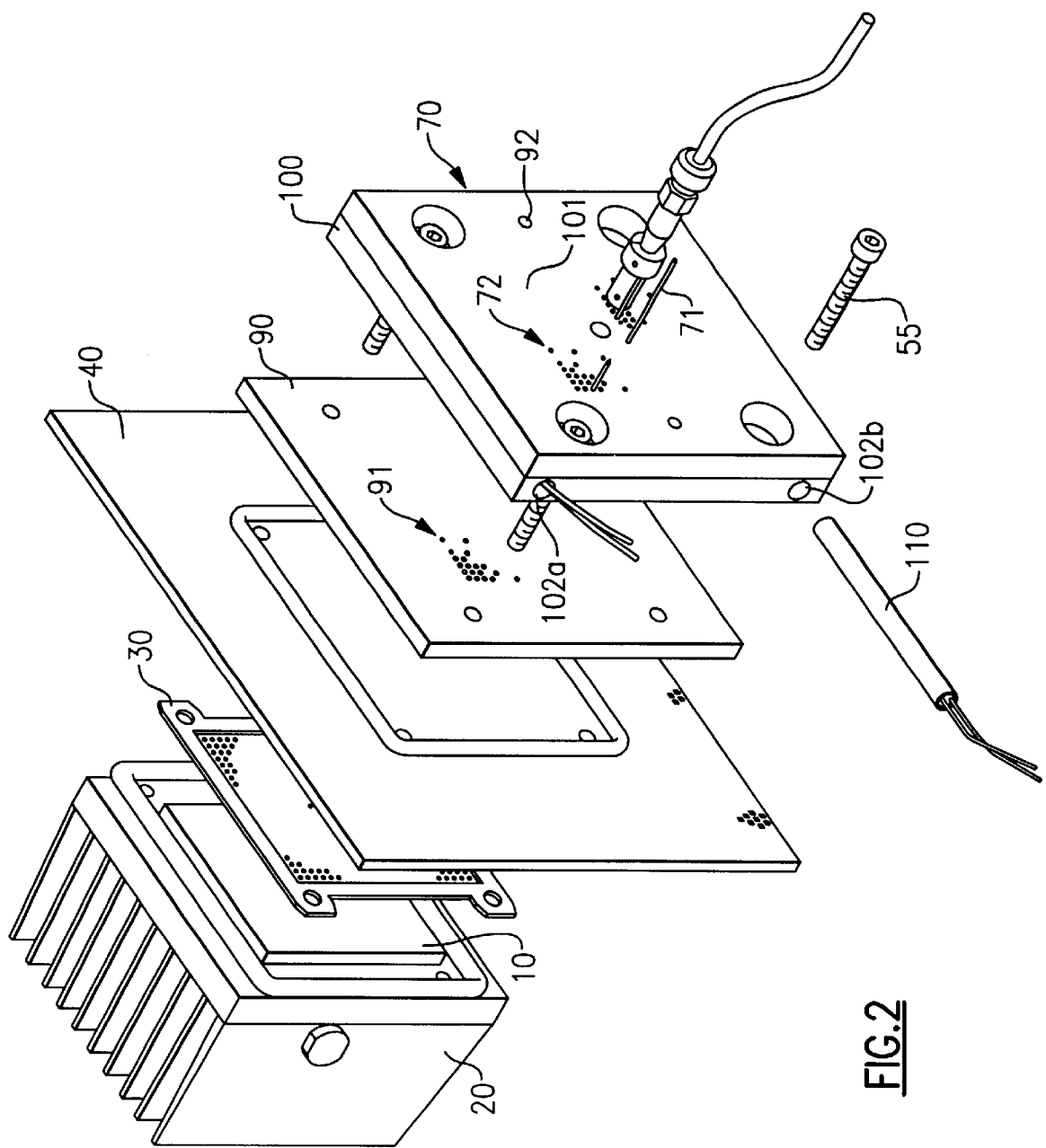
FIG. 2 illustrates an isometric exploded view of a balanced grid scheme arranged in accordance with the principles of the present invention.
Figure 2A:
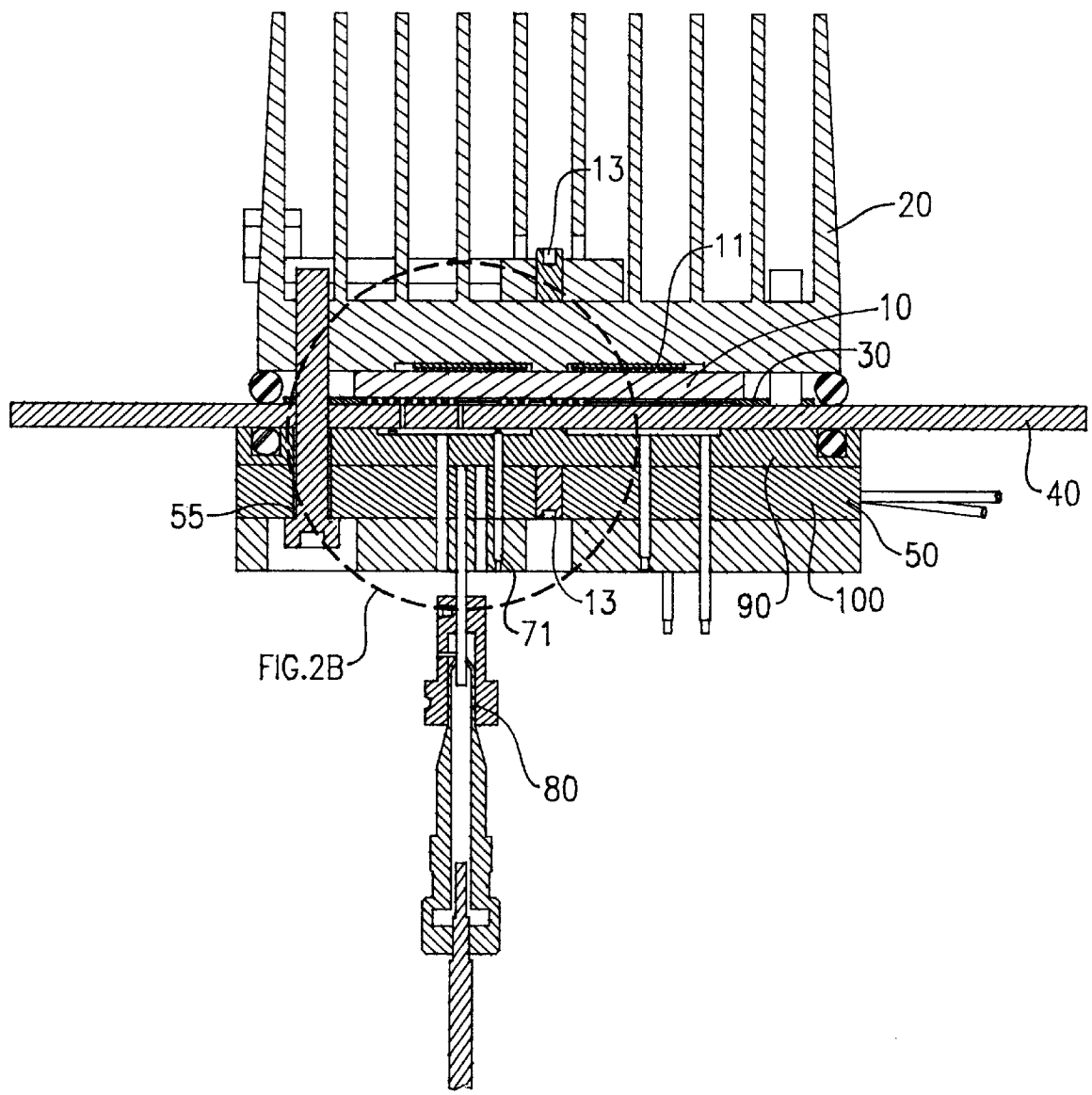
FIG. 2A illustrates a cross-sectional view of the grid scheme of FIG. 2.
Figure 2B:
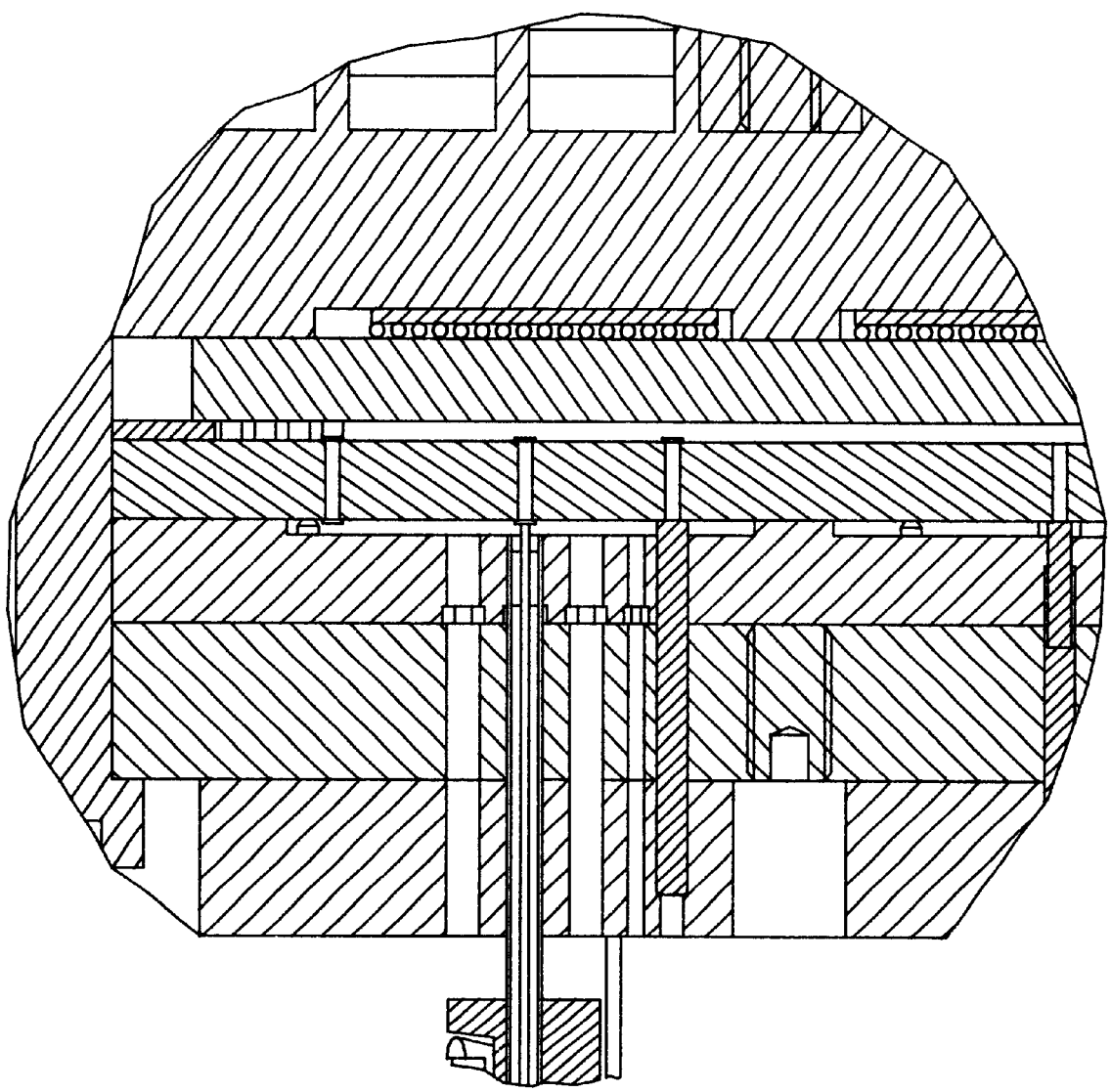
FIG. 2B sets forth more detail of area 2B of FIG. 2A.

As illustrated in FIG. 2, in a balanced grid scheme, the probe template assembly 70 is insulated from the DUT pins by a nonconducting spacer 90 made of an insulating material, such as FR4. The spacer 90 contains a plurality of holes 91 that provide access to the signal and ground locations. The gold plated brass probe template structure 100 is in direct contact to this insulation structure 90 in a manner that the plurality of holes 91 of the insulator 90 and the holes 92 in metal template 100 align. The ground pins 71, which are uniformly spaced across the I/O pad grid, provide both a countering pressure and a low inductive current path for the electrical measurement. Insulative cover 101 serves the same purpose as cover 101 in the embodiment of FIG. 1. The central support structure 13 (FIG. 2A) is also used in this design and may reduce the impact of the cooling structure on the thermo past interface 11 (FIG. 2A) that would inadvertently affect the proper cooling of the chips. The completed structure is then mounted to a system board 40 by a retaining device 55.

In situations where a reduced temperature application for the integrated circuits is used, there is a concern of moisture condensation on the pin side of the board. The use of heaters for a chilled environment is possible by incorporating heater elements 110 (FIG. 2) into the metal body 100 of the probe template structure 70, the elements 110 extending through ducts, such as 102a and 102b formed in metal plate 100. This is accomplished in two unique ways. The first is an adaptation on the use of heater elements as defined in U.S. patent application Ser. No. filed as Docket No. P0998185. The heaters are an integral part of the probe template and heat is transferred through the ground pins. As seen in FIG. 2, heat could be transferred from the metal body 100 through the pins 71 as well as through the insulation material 90 to the board 40. The insulation material 90 was previously defined as FR4 but in a heated application this could be changed to a thermo-conducting material that is also an electrical insulator. Secondly, for the application as illustrated in FIG. 1, the heaters would be part of the retaining fixture 50. This fixture could be designed with horizontal ducts that would provide dry heated air or nitrogen to be injected into the cavity defined between the space transformer 60 and the probe template metal body 100. In both methods, the air in direct contact with the pin side of the system board 40 is elevated above the dew point so that moisture condensation does not occur.

Figure 3:
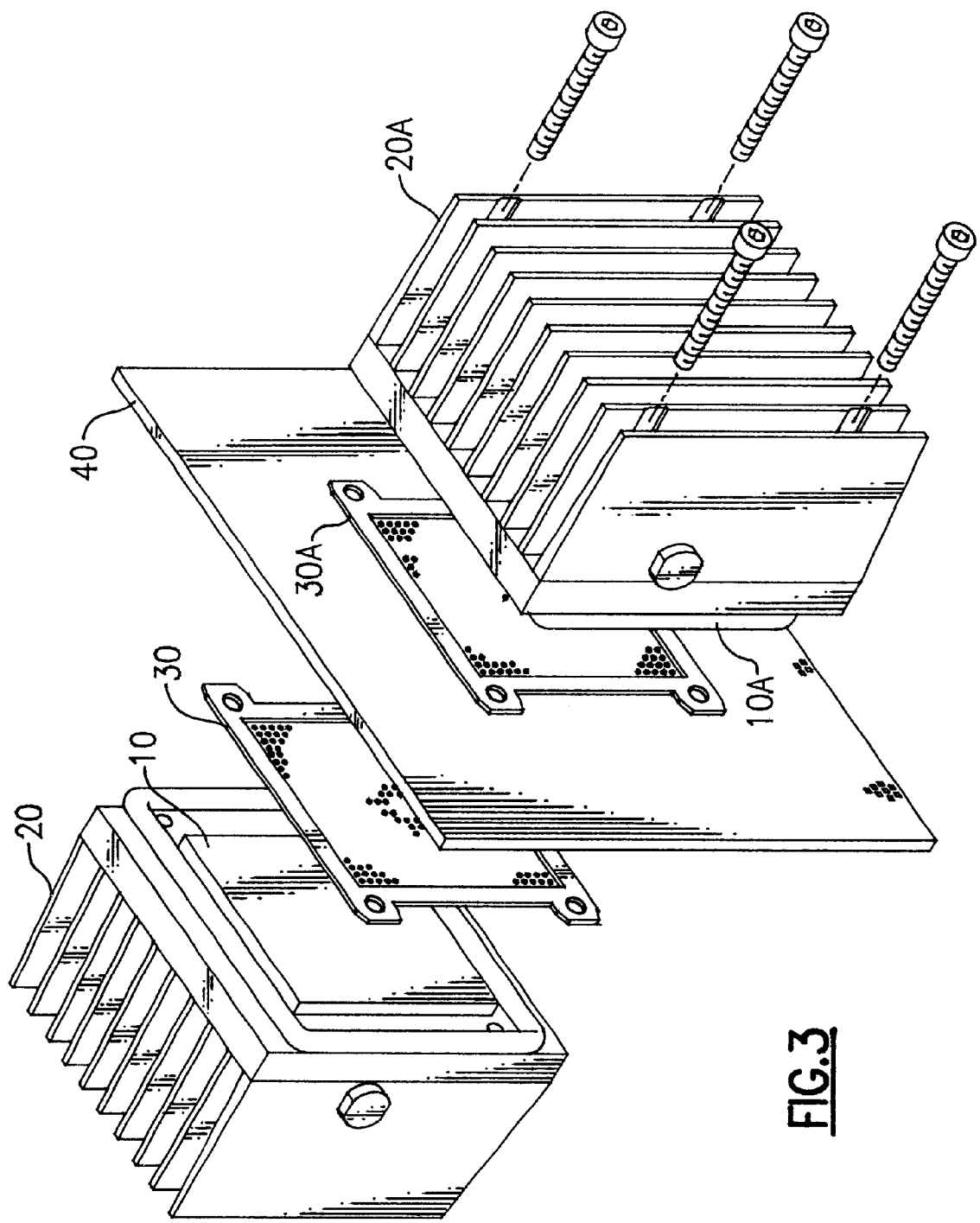
FIG. 3 illustrates an isometric exploded view of multiple MCMs mounted to a common system board in accordance with the principles of the present invention.
Figure 3A:
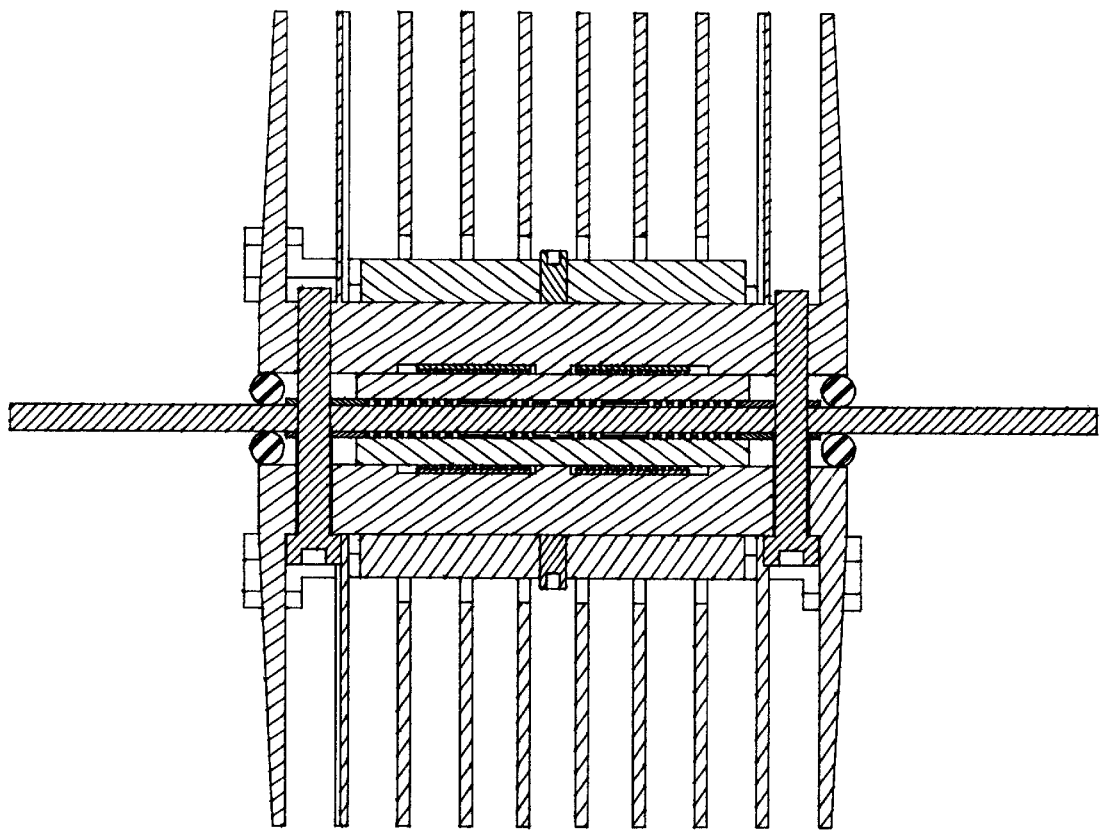
FIG. 3A illustrates further detail of the arrangement of FIG. 3.

In addition to the present application described for test purposes, there could be an advantage of using a variation of the previously described technique for system enhancement. As the packaging density increases there is a need to add as much function to a given area as possible. A new and unique way to accomplish this is to use a second MCM 10A as seen in FIG. 3 as the counter balancing load which would provide for extra functional chip sites. Since the forces on one MCM equals the force on the other, there is an equilibrium state for the fixture which is less likely to place undue stress on either MCM 10 or 10A. The MCM I/O definition of the rear side of the system board 40 would be a mirror to that of the opposite side design. The power arrangement would be a direct match, and because the signal locations match, this arrangement would provide a significantly reduced wiring interface between modules. One clear advantage is the ability to have two full function computers in direct contact to each other, thereby increasing the overall performance of the system, because of the direct connection between the systems. Another application would be to incorporate functions that are required to be as close to the MCM I/O structure as possible; such as memory or channel interface circuitry. A third application would be the reduction of size of the MCMs. By placing some functions on one MCM and the remainder on another, the overall size of the MCMs could be reduced thereby increasing the manufacturing yield.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A test probing arrangement for use with a compressive land grid array connector system wherein an integrated circuit chip substrate is compressively sandwiched between a cooling element and a system circuit board at one side of the board, the arrangement comprising:

said compressive land grid array connector system wherein an integrated circuit chip substrate is compressively sandwiched between a cooling element and a system circuit board at one side of the system circuit board and having a space transformer element for relocating inputs and outputs of a first grid spacing into a second grid spacing for said land grid array, the transformer element positioned at a side of the system circuit board opposite that holding said integrated circuit chip substrate for said land grid array;

a retaining element for holding the space transformer element against the system circuit board; and a probe template overlying the retaining element for receipt of a probe at a plurality of positions on the template for accessing the integrated circuit chip for said land grid array via the space transformer element.

2. The arrangement of claim 1 further comprising a plurality of grounding pins extending through the probe template such that ends of the pins abut the space transformer element thereby providing countering pressure and low inductive current paths for electrical measurements conducted via the probe template.

3. The arrangement of claim 1 wherein the space transformer has a thickness substantially equal to a thickness of the integrated circuit chip substrate.

4. The arrangement of claim 1 wherein the probe template further comprises a conductive plate carrying a first plurality of holes for receipt of the probe and an overlying insulative cover plate carrying a second plurality of holes for receipt of the probe.

5. The arrangement of claim 1 wherein the probe template includes a conductive plate housing at least one heating element therein.

6. A test probing arrangement for use with a compressive land grid array connector system wherein an integrated circuit chip substrate is compressively sandwiched between a cooling element and a system circuit board at one side of the board, the arrangement comprising:

said compressive land grid array connector system wherein an integrated circuit chip substrate is compressively sandwiched between a cooling element and a system circuit board at one side of the system circuit board and having a spacer element positioned at a side of the system board opposite that holding said integrated circuit chip substrate for said land grid array;

a probe template overlying the spacer element for receipt of a probe at a plurality of positions on the template for accessing the integrated circuit chips for said land grid array via the spacer element; and a retaining device for coupling the probe template and spacer element to the system board.

7. The arrangement of claim 6 further comprising a plurality of grounding pins extending through the probe template, such that ends of the pins abut the spacer element thereby providing countering pressure and low inductive current paths for electrical measurements conducted via the probe template.

8. The arrangement of claim 7 wherein the probe template includes a conductive plate housing at least one heating element, whereby heat is transferred via the conductive plate and the grounding pins to the system board.

* * * * *